United States Patent [19]
Chen

[11] Patent Number: 5,804,952
[45] Date of Patent: Sep. 8, 1998

[54] ENCAPSULATED PACKAGE FOR A POWER MAGNETIC DEVICE AND METHOD OF MANUFACTURE THEREFOR

[75] Inventor: Shiaw-Jong Steve Chen, Plano, Tex.

[73] Assignee: Lucent Technologies Inc., Murray Hill, N.J.

[21] Appl. No.: 761,041

[22] Filed: Dec. 5, 1996

[51] Int. Cl.⁶ ........................................ G05F 1/14
[52] U.S. Cl. ................................ 323/255; 363/144
[58] Field of Search ................................ 323/247, 255, 323/328, 340; 363/81, 84, 144, 125, 127, 147

[56] References Cited

U.S. PATENT DOCUMENTS

| | | | |
|---|---|---|---|
| 3,814,989 | 6/1974 | Tamkin | 317/120 |
| 3,911,475 | 10/1975 | Szedon et al. | 357/72 |
| 4,635,179 | 1/1987 | Carsten | 363/70 |
| 5,345,670 | 9/1994 | Pitzele et al. | 29/606 |
| 5,371,496 | 12/1994 | Tanamachi | 340/870.28 |
| 5,587,893 | 12/1996 | Teng | 363/61 |
| 5,621,635 | 4/1997 | Takiar | 363/141 |
| 5,642,276 | 6/1997 | Lotfi et al. | 363/144 |

*Primary Examiner*—Adolf Berhane

[57] ABSTRACT

A package for a power magnetic device containing an isolation transformer having a primary and secondary winding, and a method of manufacture therefor. The package includes: an encapsulant substantially surrounding the isolation transformer, first and second cavities formed in the encapsulant proximate the primary winding and the secondary winding, the first cavity exposing a first tap of the primary winding and adapted to receive a switch therein, the first tap of the primary winding adapted to couple the switch to the primary winding, the second cavity exposing a first tap of the secondary winding and adapted to receive a first rectifying device therein, the first tap of the secondary winding adapted to couple the first rectifying device to the secondary winding, the first and second cavities adapted to be encapsulated after receiving the switch and the first rectifying device therein to allow the switch, the first rectifying device and the primary and secondary windings of the isolation transformer to be joined into a unitarily encapsulated package.

28 Claims, 9 Drawing Sheets

ENCAPSULATED PACKAGE FOR A POWER MAGNETIC DEVICE AND METHOD OF MANUFACTURE THEREFOR

TECHNICAL FIELD OF THE INVENTION

The present invention is directed, in general, to power supplies and, more specifically, to an encapsulated package for a power magnetic device and method of manufacture therefor.

BACKGROUND OF THE INVENTION

A power converter is a power processing circuit that converts an input voltage waveform into a specified output voltage waveform. In many applications requiring a DC output, switched-mode DC/DC converters are frequently employed to advantage. DC/DC converters generally include an inverter, an input/output isolation transformer and a rectifier on a secondary side of the isolation transformer. The inverter generally includes a switching device, such as a field effect transistor ("FET"), that converts the DC input voltage to an AC voltage. The input/output isolation transformer, then, transforms the AC voltage to another value and the rectifier generates the desired DC voltage at the output of the power converter.

Conventionally, the rectifier comprises a plurality of rectifying diodes that conduct the load current only when forward-biased in response to the input waveform to the rectifier. Alternatively, a more efficient rectifier can be attained in converters by replacing the rectifying diodes with active switches, such as FETs. The switches are periodically toggled between conduction and nonconduction modes in synchronization with the periodic waveform to be rectified. A rectifier employing active switches is conventionally referred to as a synchronous rectifier.

When the input voltage is, for instance, stepped down across a step-down isolation transformer in the power converter, the current capacity required on the secondary side of the transformer and the rectifier is significantly higher than that on the primary side of the transformer. As a result, the power converter suffers efficiency losses on the secondary side of the isolation transformer that impair the overall performance of the power converter. The path between the isolation transformer and the rectifier is of acute interest because it carries high alternating current that is subject to onerous losses. Furthermore, the path between the inverter and the isolation transformer and, especially, the path between the isolation transformer and the rectifier realize stray inductances that also impair the efficiency of the power converter. Therefore, efforts to minimize the losses associated with the paths between the inverter or switch, isolation transformer and the rectifier would improve the overall performance of the power converter.

In addition to efficiency improvements, increased power density is a continuing goal of modern power supply (e.g., power converter) design. High power density is particularly crucial in applications wherein the allocated space for the power supply relative to the power output is restricted. In addition to being highly compact, the power supply should be efficient to limit heat-generating power dissipation. To dissipate the heat generated in the power supply, typically, heat sinks are mounted on the power supply components. Individual heat sinks for the discrete components of the power converter raise some concerns, namely, it creates additional costs that cannot be readily absorbed in a cost competitive market; also, it decreases the flexibility necessary to design a higher circuit density power supply.

As those of ordinary skill in the art understand, it is, therefore, highly desirable to provide a protective, heat-dissipating package for the electronic circuitry of the power supply. Often, such circuitry can be encapsulated or "molded," wherein an encapsulant is formed about the circuitry to yield a unitary, board-mountable package. One well known configuration for board-mountable package is a so-called dual in-line package ("DIP"), wherein electrical leads protrude from opposing sidewalls of the package. The leads are advantageously so arranged to allow the package to be mounted to a circuit board by various conventional soldering processes. DIPs are widely used for packaging integrated circuits, most often in computer-related environments.

The advantage of packaging discrete power components into an integrated power module has been addressed in the prior art. More specifically, a surface-mounted transformer-diode power module is disclosed in a U.S. patent application, Ser. No. 08/385,495, filed on Feb. 8, 1995, by Lotfi, et al., entitled "High Frequency Surface Mount Transformer-Diode Power Module," commonly assigned with the present invention and incorporated herein by reference. Lotfi, et al. discloses a transformer-diode module that packages a transformer winding and diode into a single module to take advantage of higher power density and improved electrical performance by coupling the two discrete components together. However, Lotfi, et al. may be improved upon to further increase the power density and electrical performance of a power supply device incorporating multiple power components.

Accordingly, what is needed in the art is an encapsulated package for a power module, including components such as an inverter or switch, transformer winding and rectifier, that may be implemented in a high power density and high performance power supply.

SUMMARY OF THE INVENTION

To address the above-discussed deficiencies of the prior art, the present invention provides a package for a power magnetic device containing an isolation transformer having a primary and secondary winding, and a method of manufacture therefor.

The package includes: an encapsulant substantially surrounding the isolation transformer, first and second cavities formed in the encapsulant proximate the primary winding and the secondary winding, the first cavity exposing a first tap of the primary winding and adapted to receive a switch therein, the first tap of the primary winding adapted to couple the switch to the primary winding, the second cavity exposing a first tap of the secondary winding and adapted to receive a first rectifying device therein, the first tap of the secondary winding adapted to couple the first rectifying device to the secondary winding, the first and second cavities adapted to be encapsulated after receiving the switch and the first rectifying device therein to allow the switch, the first rectifying device and the primary and secondary windings of the isolation transformer to be joined into a unitarily encapsulated package.

The package for the power magnetic device provides the first and second cavities to couple the switch and the rectifying device to the encapsulated windings of the isolation transformer. The package therefore decreases the path between the inverter or switch and the isolation transformer and the path between the windings and the rectifying device to thereby reduce the stray inductances that impair the efficiency of a power supply employing the power magnetic device to advantage. As a result, the packaged power magnetic device eliminates the requirement of employing additional circuitry (e.g., a snubber circuit) in the power supply employing the device to obviate the stray leakage inductances therein. Finally, the package integrates the discrete components into a single module to take advantage of higher power density and, ultimately, a highly compact board-mountable packaged power magnetic device.

In an alternative embodiment of the present invention, the primary winding of the isolation transformer includes a second tap. The first tap of the primary winding is coupled to a first power input lead of the package and the second tap of the primary winding is coupled to a second power input lead of the package. In a related but alternative embodiment, the secondary winding of the isolation transformer includes a center tap. The first tap of the secondary winding is coupled to a first power output lead of the package and the center tap of the secondary winding is coupled to a second power output lead of the package.

In an alternative embodiment of the present invention, the package includes a plurality of leads for receiving the isolation transformer; the primary and secondary windings of the isolation transformer are thereby coupled to the leads.

In an alternative embodiment of the present invention, a first, second and third terminal of the switch are collinear; the first terminal of the switch is coupled to the first tap of the primary winding. The compact design and collinear arrangement of the terminals of the switch facilitate the coupling of the switch and primary winding within the first cavity of the package.

In an alternative embodiment of the present invention, the secondary winding of the isolation transformer includes a second tap. The second tap of the secondary winding is adapted to couple a second rectifying device to the secondary winding. In a related, but alternative embodiment, the encapsulant surrounds the first and second cavities to form the unitarily encapsulated package. The switch, first and second rectifying devices, and windings of the isolation transformer are joined into a unitarily encapsulated package.

In an alternative embodiment of the present invention, the encapsulant has a third cavity formed therein proximate the secondary winding; the third cavity exposes a second tap of the secondary winding and is adapted to receive a second rectifying device therein. The second tap of the secondary winding is adapted to couple the second rectifying device to the secondary winding. In a related, but alternative embodiment, the first, second and third cavities are encapsulated after receiving the switch, the first rectifying device and the second rectifying device therein to allow the switch, the first rectifying device, the second rectifying device and the primary and secondary windings of the isolation transformer to be joined into a unitarily encapsulated package.

Another aspect of the present invention is a power converter comprising control circuitry and a power train having an input couplable to a source of electrical power and an output couplable to an electrical load. The power train employs a packaged power magnetic device adapted to be formed into a unitarily encapsulated package. The packaged power magnetic device is constructed according to the present invention as broadly defined herein.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
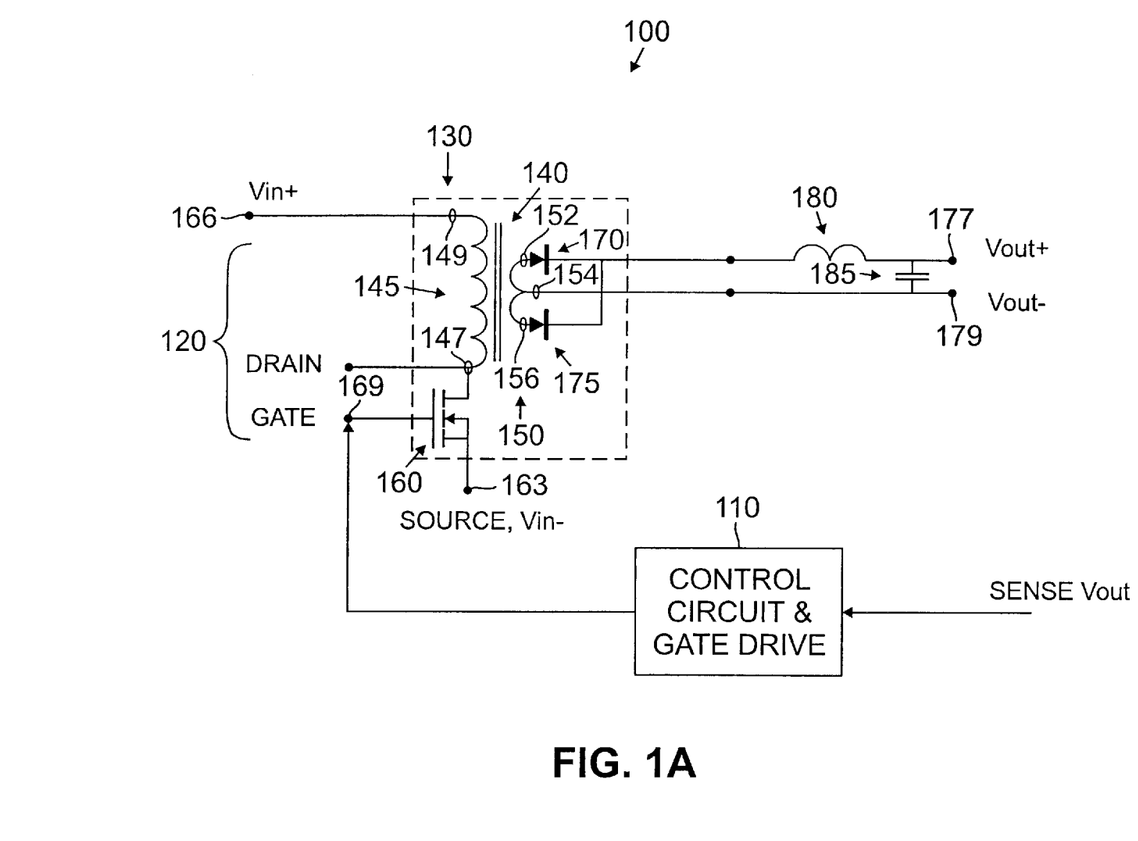
FIGS. 1A and 1B illustrate schematic diagrams of a power converter employing alternative embodiments of a packaged power magnetic device in accordance with the principles of the present invention.

Referring initially to FIG. 1A, illustrate is a schematic diagram of a power converter 100 employing a packaged power magnetic device 130 in accordance with the principles of the present invention. The power converter 100 includes control circuitry 110 for applying control signals to a power train 120. The power train 120 has an input coupled to a source of electrical power (for receiving an input voltage $V_{in}$) and a DC output coupled to an electrical load (thereby providing an output voltage $V_{out}$ to the load). The power train 120 includes the packaged power magnetic device 130 having an isolation transformer 140 with a primary winding 145 and secondary winding 150.

An encapsulant (see FIGS. 2A and 2B) substantially surrounds the windings of the isolation transformer 140 with first and second cavities (see FIG. 2A) formed in the encapsulant proximate the primary winding 145 and the secondary winding 150. The first cavity exposes a first tap 147 of the primary winding 145 and is adapted to receive a switch 160 therein. The first tap 147 of the primary winding 145 couples the switch 160 to the primary winding 145. The second cavity exposes a first tap 152 and a second tap 156 of the secondary winding 150 and is adapted to receive a rectifier circuit (comprising a pair of rectifying diodes 170, 175) therein. The rectifying diodes 170, 175 rectify the periodic waveform supplied thereto by the secondary winding 150. The first and second taps 152, 156 of the secondary winding 150 couple the rectifying diodes 170, 175, respectively, to the secondary winding 150. The first and second cavities are adapted to be encapsulated subsequent to receipt of the switch 160 and the rectifying diodes 170, 175 therein to allow the switch 160, the rectifying diodes 170, 175 and the isolation transformer 140 to be joined into a unitarily encapsulated package.

The primary winding 145 of the isolation transformer 140 also includes a second tap 149. The first tap 147 of the primary winding 145 is further coupled to a first power input lead 163 (through the switch 160) and the second tap 149 of the primary winding 145 is coupled to a second power input lead 166. The secondary winding 150 of the isolation transformer 140 also includes a center tap 154. The first and second taps 152, 156 of the secondary winding 150 are coupled to a first power output lead 177 and the center tap 154 of the secondary winding 150 is coupled to a second power output lead 179. The packaged power magnetic device 130 still further has a control input lead 169 that couples the control circuitry 110 to the switch 160. The power converter 100 also includes a low-pass filter comprising an inductor 180 and a capacitor 185 that acts on the rectified waveform to supply the DC output voltage $V_{out}$. The packaged power magnetic device 130 employs the isolation transformer 140 and rectifying diodes 170, 175 to convert an AC electrical power into DC electrical power.

The packaged power magnetic device 130 therefore decreases the path between the switch 160 and the isolation transformer 140 and the path between the isolation transformer 140 and the rectifying diodes 170, 175 to thereby reduce the stray inductances that impair the efficiency of the power converter 100 employing the packaged power magnetic device 130 to advantage. As a result, the packaged power magnetic device 130 reduces the requirement of employing additional circuitry (e.g., a snubber circuit) in the power converter 100 employing the package 130 to obviate the stray leakage inductances therein. Finally, the packaged power magnetic device 130 integrates the discrete components into a single module to take advantage of higher power density and, ultimately, a highly compact board-mountable power magnetic device.

Although the packaged power magnetic device 130 employs a power switch FET for the switch 160, alternatively, other switches (e.g., bipolar transistors) are well within the broad scope of the present invention. Also, while the packaged power magnetic device 130 employs the rectifying diodes 170, 175, alternatively, other rectifying devices and circuits (e.g., active switches, such as FETs, in a synchronous rectifier) may be employed to advantage.

The encapsulant may surround the first and second cavities to form a unitarily encapsulated package for the packaged power magnetic device 130 and the packaged power magnetic device 130 and other power supply circuitry may be surrounded by the encapsulant to thereby form a power converter module. In this environment, the present invention provides an encapsulated power converter 100 that may be mounted to a circuit board as easily and conventionally as any other electronic components.

Figure 1B:
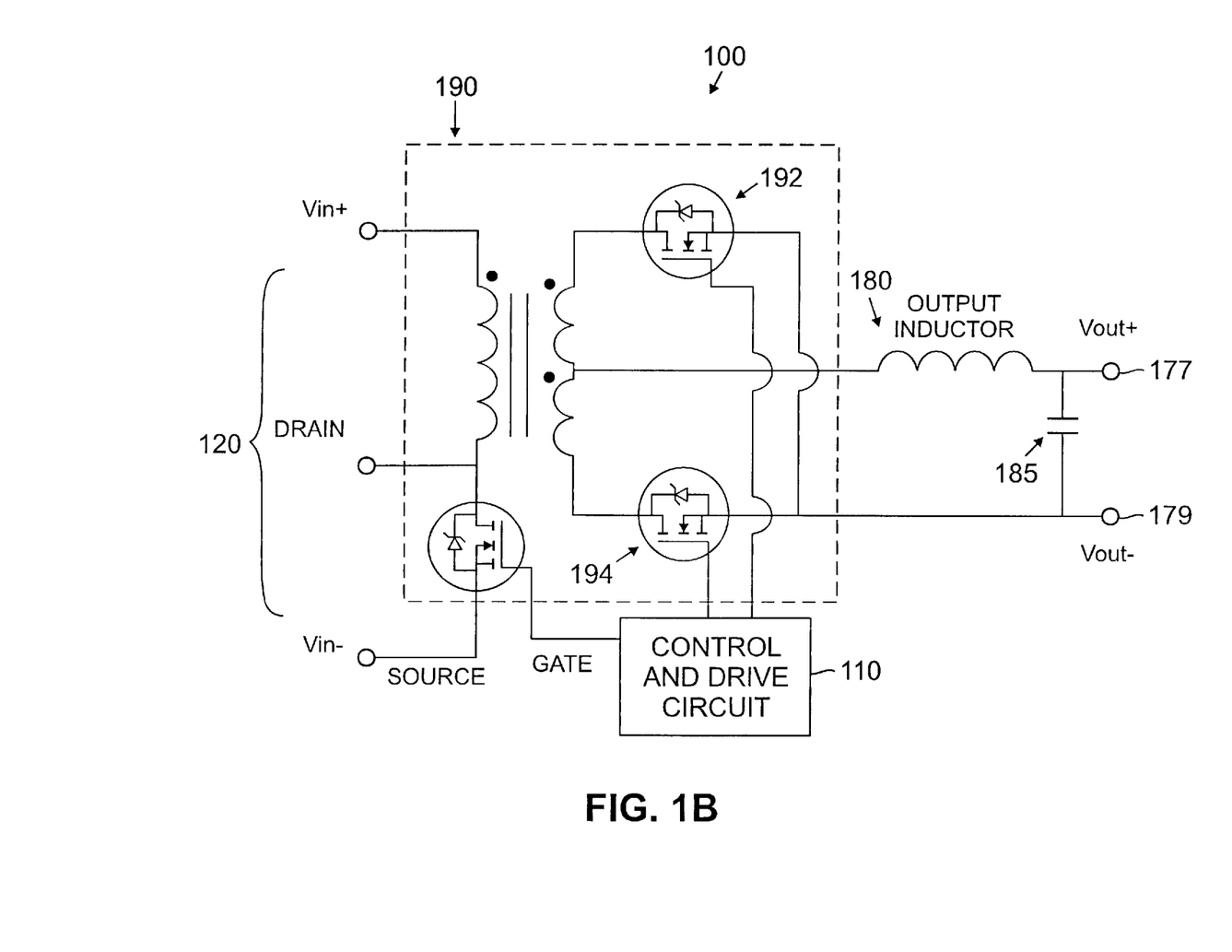

Turning now to FIGURE 1B, illustrated is a schematic diagram of the power converter 100 of FIG. 1A employing an alternative embodiment of a packaged power magnetic device 190 constructed according to the principles of the present invention. The rectifying diodes 170, 175 of the packaged power magnetic device 130 are replaced by a first and second rectifying switch 192, 194 in the packaged power magnetic device 190. Those skilled in the art should understand the operation and benefits associated with employing active switches in rectifier circuits of power converters.

Figure 2A:
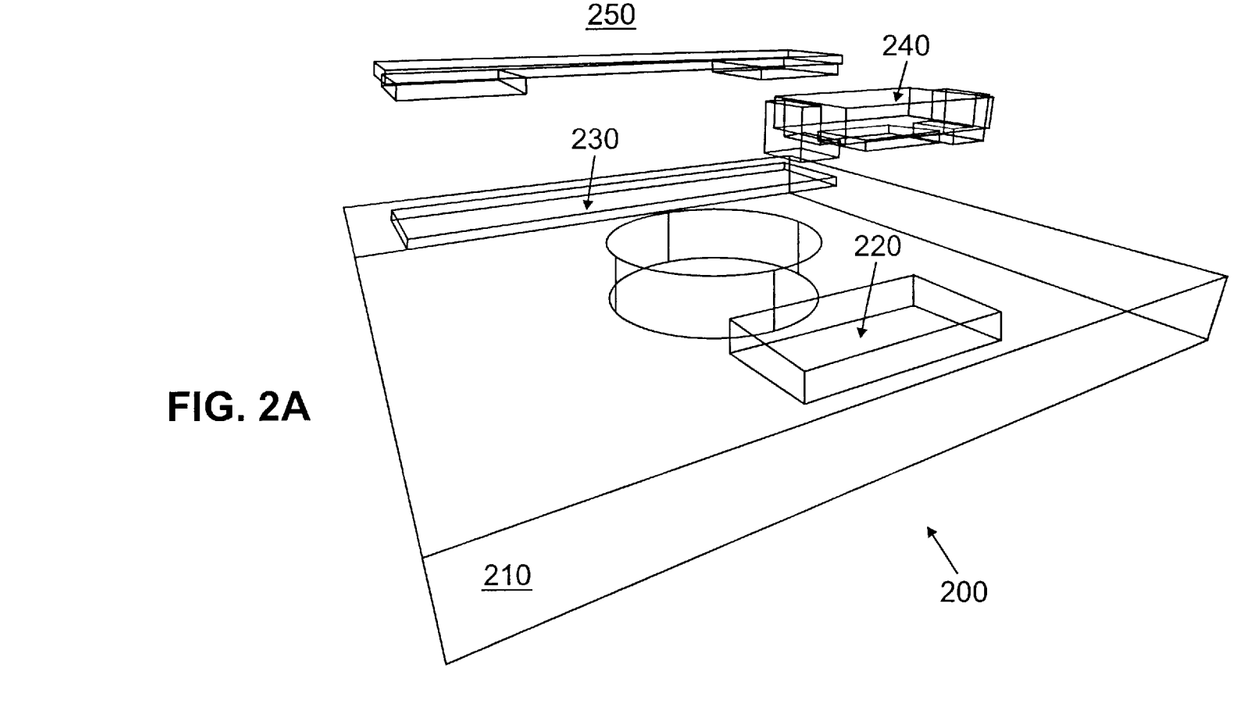
FIGS. 2A and 2B illustrate perspective views of alternative embodiments of a package for a power magnetic device constructed according to the principles of the present invention.

Turning now to FIG. 2A, illustrated is a perspective view of a package 200 for a power magnetic device (see FIGS. 1A and 1B) constructed according to the principles of the present invention. The package 200 contains an isolation transformer having a primary and secondary winding as illustrated in FIGS. 1A and 1B. An encapsulant (e.g., a thermosetting epoxy molding compound) 210 substantially surrounds the windings of the isolation transformer and includes a first cavity 220 and a second cavity 230 formed therein proximate the primary winding and the secondary winding, respectively. The first cavity 220 exposes a first tap of the primary winding (see FIGS. 1A and 1B) and is adapted to receive a switch 240 therein thereby coupling the switch 240 to the primary winding. The second cavity 230 exposes a first and second tap of the secondary winding (see FIGS. 1A and 1B) and is adapted to receive a rectifier circuit 250 therein thereby coupling the rectifier circuit 250 to the secondary winding. The first and second cavities 220, 230 are adapted to be encapsulated subsequent to receipt of the switch 240 and the rectifier circuit 250 to allow the switch 240, rectifier circuit 250 and isolation transformer to be joined into a unitarily encapsulated package.

An exemplary method of manufacturing the package 200 includes the following steps. The primary and secondary windings of the isolation transformer are coupled to a plurality of leads of a lead frame. The first tap of the primary winding is coupled to a first power input lead (see FIGUREs 1A and 1B) and a second tap of the primary winding is coupled to a second power input lead (see FIGS. 1A and 1B). Also, the first tap of the secondary winding is coupled to a first power output lead (see FIGS. 1A and 1B) and the center tap of the secondary winding is coupled to a second power output lead (see FIGS. 1A and 1B). Once the transformer is coupled to the plurality of leads, an outer periphery of the lead frame is removed. Coupling a transformer to a lead frame is also disclosed in U.S. patent application, Ser. No. 08/640,583, filed on Apr. 12, 1996, by Chen, et al., entitled "Encapsulated, Integrated Power Magnetic Device and Method of Manufacture Therefor," commonly assigned with the present invention and incorporated herein by reference.

The isolation transformer is then substantially surrounded with the encapsulant 210 forming the first and second cavities 220, 230 in the encapsulant proximate the primary winding and the secondary windings. The first cavity 220 exposes the first tap of the primary winding (coupled to a lead) and is adapted to receive the switch 240 (via a terminal) therein. The second cavity exposes the first and second tap of the secondary winding (coupled to a lead) and is adapted to receive the rectifier circuit 250 therein. The first and second cavities 220, 230 may then be encapsulated after receiving the switch 240 and the rectifier circuit 250 therein to allow the switch 240, rectifier circuit 250 and the primary and secondary windings of the isolation transformer to be joined into a unitarily encapsulated package.

Those skilled in the art should be aware of the conventional use of the thermosetting epoxy molding compound as an encapsulant for electronic circuitry. Those of ordinary skill in the art should also be aware the other encapsulating materials are well within the broad scope of the present invention.

Figure 2B:
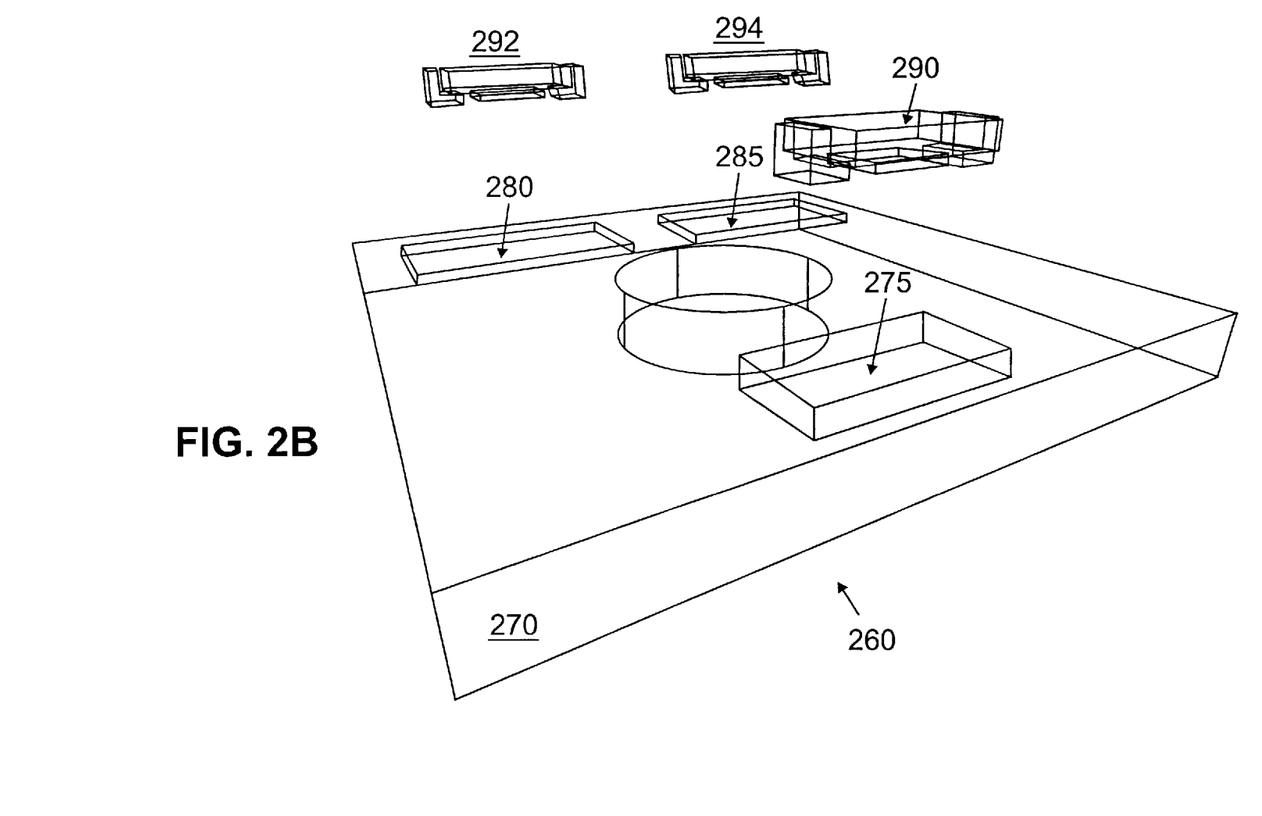

Turning now to FIG. 2B, illustrated is a perspective view of an alternative embodiment of a package 260 for a power magnetic device constructed according to the principles of the present invention. Analogous to the package 200 of FIG. 2A, the package 260 includes an isolation transformer having a primary and secondary winding. An encapsulant 270 substantially surrounds the windings of the isolation transformer and includes a first cavity 275, and a second cavity 280 and third cavity 285 formed therein proximate the primary winding and the secondary winding, respectively. The first cavity 275 exposes a first tap of the primary winding and is adapted to receive a switch 290 therein thereby coupling the switch 290 to the primary winding. The second cavity and third cavities 280, 285 expose a first tap and a second tap of the secondary winding (see FIGS. 1A and 1B) and are adapted to receive a first and second rectifying switch 292, 294, respectively, therein thereby coupling the first and second rectifying switches 292, 294 to the secondary winding. The first, second and third cavities 275, 280, 285 are adapted to be encapsulated subsequent to receipt of the switch 290 and the first and second rectifying switches 292, 294 to allow the switch 290, the first and second rectifying switches 292, 294, and the isolation transformer to be joined into a unitarily encapsulated package. Of course, the first and second rectifying switches 292, 294 may be interchangeably replaced with rectifying diodes.

Figure 3A:
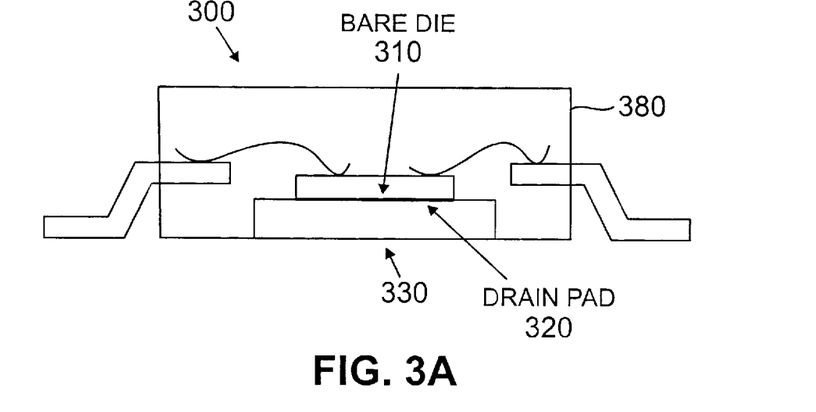
FIGS. 3A and 3B illustrate an embodiment of a switch employable in the package for the power magnetic device constructed according to the principles of the present invention.
Figure 3B:
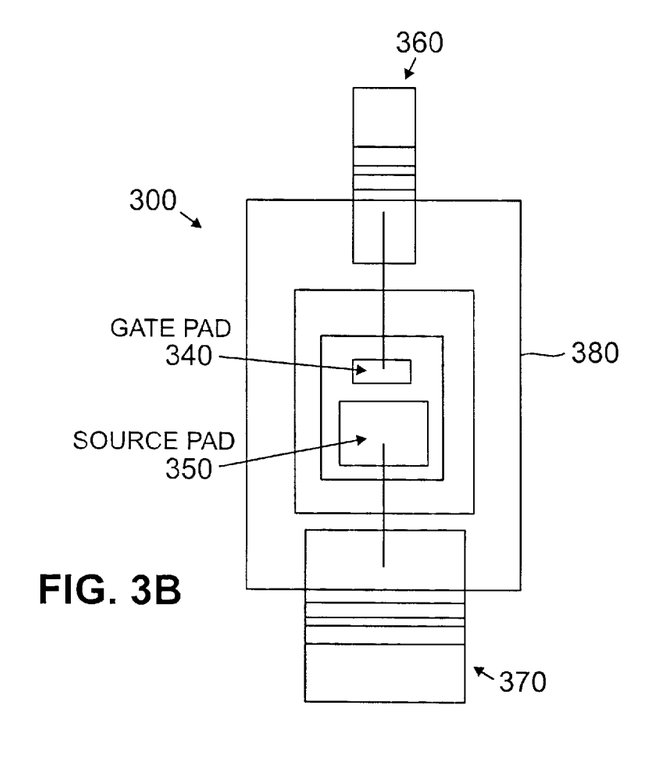

Turning now to FIGS. 3A and 3B, illustrated is an embodiment of a switch 300 employable in the package for the power magnetic device (see FIGS. 1A, 1B, 2A, 2B) constructed according to the principles of the present invention. FIG. 3A illustrates a side view of the switch 300 and FIG. 3B illustrates a top view of the switch 300. A bottom side of a bare die 310 of the switch 300 is coupled to a drain pad 320; a first terminal 330 of the switch 300 (proximate the drain pad 320) is coupled to the first tap of the primary winding of the isolation transformer (see FIGS. 1A and 1B). A gate pad 340 and source pad 350 of the switch 300 are located on the top side of the bare die 310. A second terminal 360 and third terminal 370 of the switch 300 are wire bonded to the gate pad 340 and source pad 350, respectively. The first terminal 330, second terminal 360 and third terminal 370 of the switch 300 are collinear. The second and third terminals 360, 370 are formed in a gull-wing shape for mounting to the package for the power magnetic device. The switch 300 is encapsulated with an encapsulant 380 such as a thermosetting epoxy molding compound. The collinear arrangement of the terminals 330, 360, 370 and compact size of the switch 300 facilitate use with the package of the power magnetic device of the present invention.

Figure 4A:
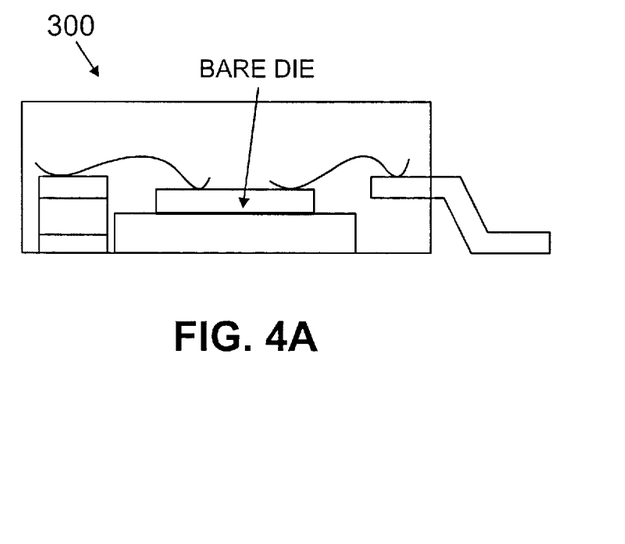
FIGS. 4A and 4B illustrate an alternative embodiment of the switch of FIGS. 3A and 3B.
Figure 4B:
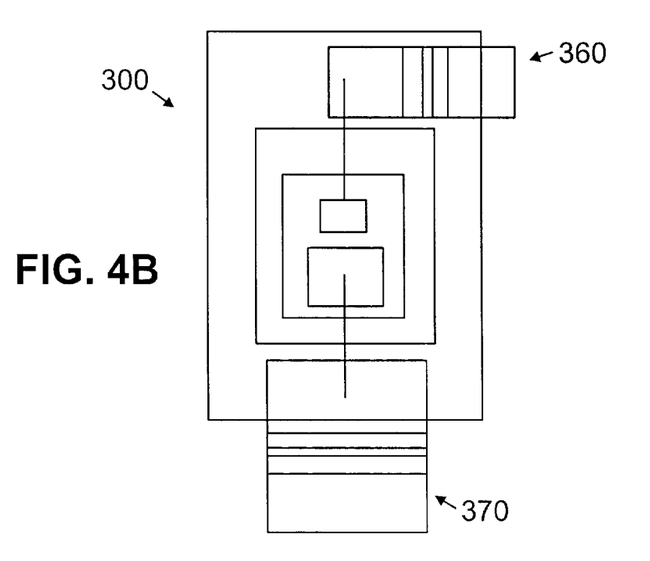

Turning now to FIGS. 4A and 4B, illustrated is an alternative embodiment of the switch 300 of FIGS. 3A and 3B. FIG. 4A illustrates a side view of the switch 300 and FIG. 4B illustrates a top view of the switch 300. The second terminal 360 of the alternative embodiment of the switch 300 is rotated 90 degrees with respect to the third terminal 370. The asymmetrical arrangement of the terminals 360, 370 facilitates connection of the switch 300 to the package of the power magnetic device or any other component having asymmetrical connection locations; the arrangement also facilitates the orientation identification for automatic pick and placement machines.

Figure 5A:
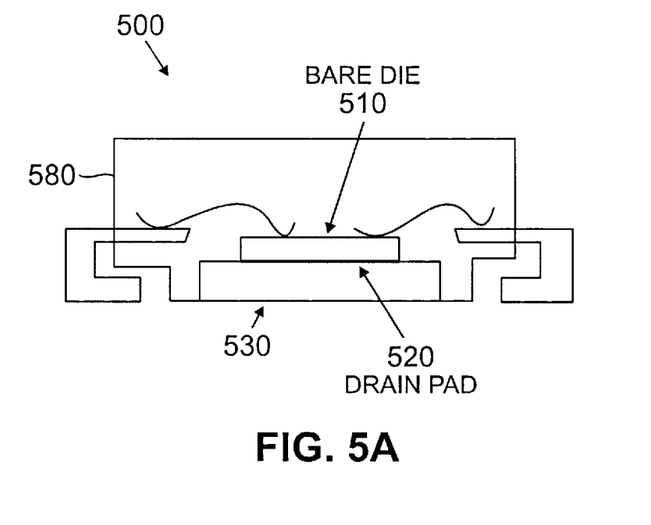
FIGS. 5A and 5B illustrate another embodiment of a switch employable in the package for the power magnetic device constructed according to the principles of the present invention.
Figure 5B:
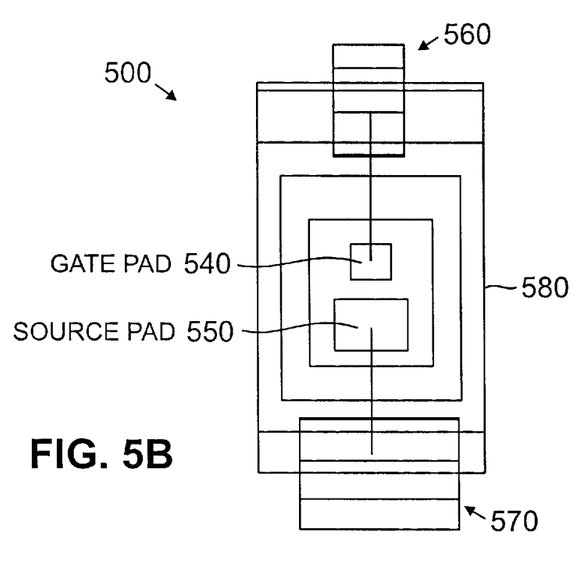

Turning now to FIGS. 5A and 5B, illustrated is another embodiment of a switch 500 employable in the package for the power magnetic device (see FIGS. 1A, 1B, 2A, 2B) constructed according to the principles of the present invention. FIG. 5A illustrates a side view of the switch 500 and FIG. 5B illustrates a top view of the switch 500. Analogous to the switch 300 of FIGS. 3 and 4, a bottom side of a bare die 510 of the switch 500 is coupled to a drain pad 520; a first terminal 530 of the switch 500 (proximate the drain pad 520) is coupled to the first tap of the primary winding of the isolation transformer (see FIGS. 1A and 1B). A gate pad 540 and source pad 550 of the switch 500 are located on the top side of the bare die 510. A second terminal 560 and third terminal 570 of the switch 500 are wire bonded to the gate pad 540 and source pad 550, respectively. The first terminal 530, second terminal 560 and third terminal 570 of the switch 500 are collinear. The second and third terminals 560, 570 are formed downward and inward to provide a J-lead shape for mounting to the package for the power magnetic device. The switch 500 is encapsulated with an encapsulant 580 such as a thermosetting epoxy molding compound. The collinear arrangement of the terminals 530, 560, 570 and compact size of the packaged switch 300 facilitate use with the package of the power magnetic device of the present invention.

Figure 6A:
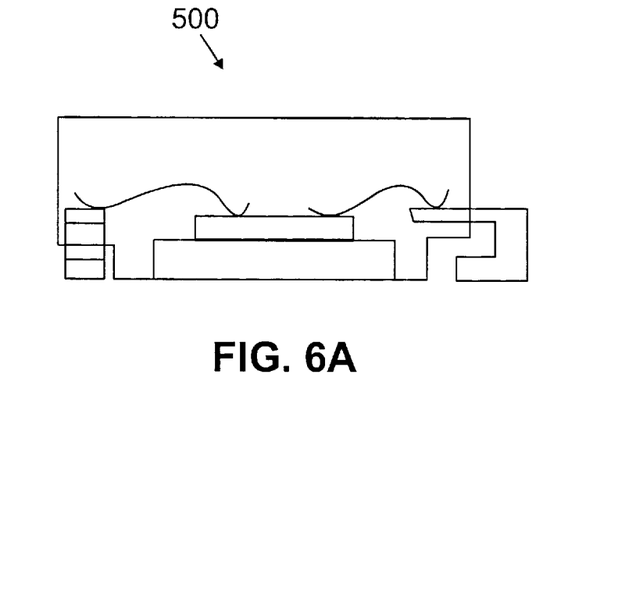
FIGS. 6A and 6B illustrate an alternative embodiment of the switch of FIGS. 5A and 5B.
Figure 6B:
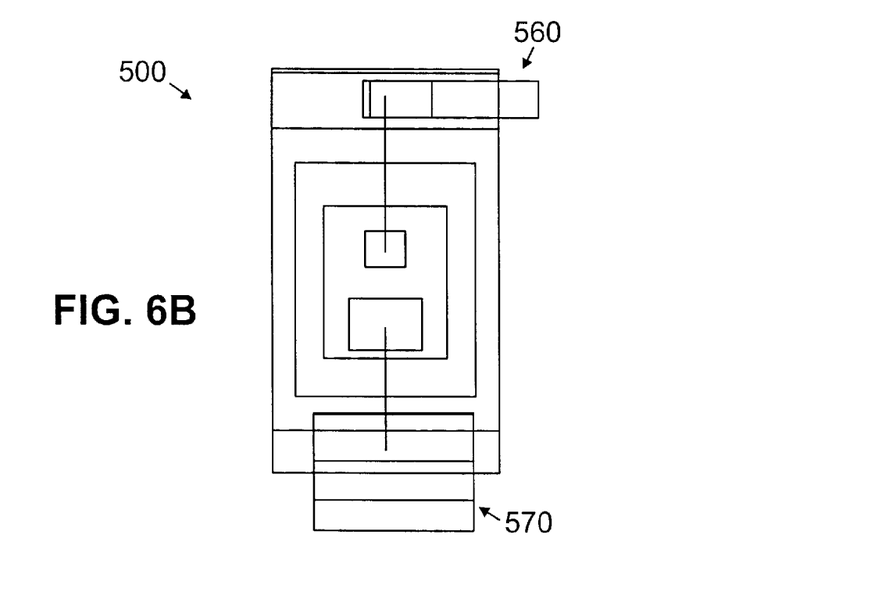

Turning now to FIGS. 6A and 6B, illustrated is an alternative embodiment of the switch 500 of FIGS. 5A and 5B. FIG. 6A illustrates a side view of the switch 500 and FIG. 6B illustrates a top view of the switch 500. The second terminal 560 of the alternative embodiment of the switch 500 is rotated 90 degrees with respect to the third terminal 570. The asymmetrical arrangement of the terminals 560, 570 facilitates connection of the switch 500 to the package of the power magnetic device or any other component having asymmetrical connection locations; the arrangement also facilitates the orientation identification for automatic pick and placement machines.

Figure 7A:
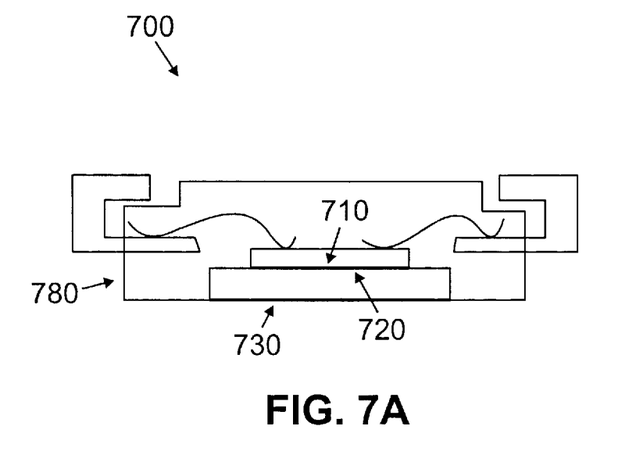
FIGS. 7A and 7B illustrate another embodiment of a switch employable in the package for the power magnetic device constructed according to the principles of the present invention.
Figure 7B:
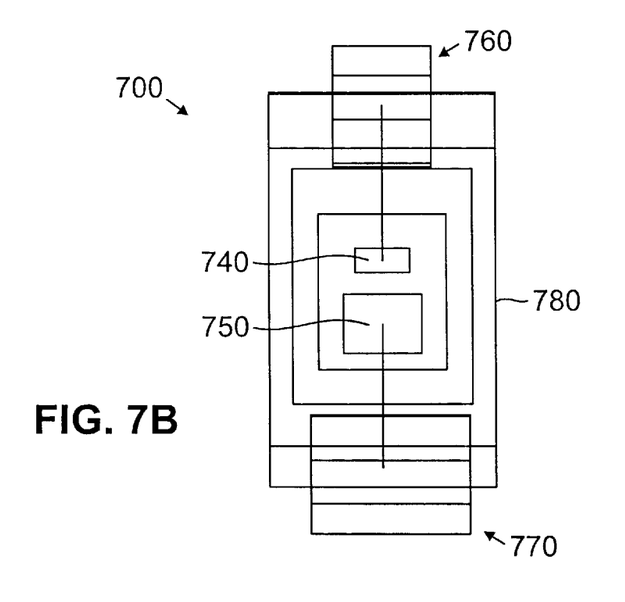

Turning now to FIGS. 7A and 7B, illustrated is another embodiment of a switch 700 employable in the package for the power magnetic device (see FIGS. 1A, 1B, 2A, 2B) constructed according to the principles of the present invention. FIG. 7A illustrates a side view of the switch 700 and FIG. 7B illustrates a top view of the switch 700. Analogous to the switches 300, 500 of FIGS. 3 to 6, a bottom side of a bare die 710 of the switch 700 is coupled to a drain pad 720; a first terminal 730 of the switch 700 (proximate the drain pad 720) is coupled to the first tap of the primary winding of the isolation transformer (see FIGS. 1A and 1B). A gate pad 740 and source pad 750 of the switch 700 are located on the top side of the bare die 710. A second terminal 760 and third terminal 770 of the switch 700 are wire bonded to the gate pad 740 and source pad 750, respectively. The second and third terminals 760, 770 are formed upward and inward to provide a J-lead shape. The switch 700 is encapsulated with an encapsulant 780 such as a thermosetting epoxy molding compound. After the switch 700 is assembled into the cavity of the power magnetic device, the second and third terminals 760, 770 are exposed as two additional terminals of the power magnetic device.

While the illustrated embodiments of the switch employ a lead frame having a plurality of leads, those skilled in the art should understand that other construction techniques and components (e.g., a ceramic chip carrier) are well within the broad scope of the present invention. As previously mentioned, the first terminal of the switch is coupled to the first tap of the primary winding; the first terminal of the switch may be a copper tab; the copper tab is employed to facilitate the connectivity between the switch and the primary winding and to enhance the thermal dissipation within the packaged device. Also, while the package for the power magnetic device is described employing a lead frame having a plurality of leads, other embodiments and construction techniques are well within the broad scope of the present invention. Furthermore, the previously described embodiments of the power converters and the packages for the power magnetic devices, including the design of the isolation transformer coupled to the switch and rectifier (e.g., the tap structure of the windings), are submitted for illustrative purposes only.

For a better understanding of power electronic devices (including semiconductor devices) and the associated fabrication processes see *Power Semiconductor Devices*, by B. Jayant Baliga, North Carolina State University (1995). Also, for a better understanding of power electronics including power supplies and conversion technologies see *Principles of Power Electronics*, by J. G. Kassakian, M. F. Schlecht and G. C. Verghese, Addison-Wesley (1991). The aforementioned references are herein incorporated by reference.

Although the present invention has been described in detail, those skilled in the art should understand that they can make various changes, substitutions and alterations herein without departing from the spirit and scope of the invention in its broadest form.

What is claimed is:

1. A package for a power magnetic device containing an isolation transformer having a primary and secondary winding, said package comprising:

an encapsulant substantially surrounding said isolation transformer, first and second cavities formed in said encapsulant proximate said primary winding and said secondary winding, said first cavity exposing a first tap of said primary winding and adapted to receive a switch therein, said first tap of said primary winding adapted to couple said switch to said primary winding, said second cavity exposing a first tap of said secondary winding and adapted to receive a first rectifying device therein, said first tap of said secondary winding adapted to couple said first rectifying device to said secondary winding, said first and second cavities adapted to be encapsulated after receiving said switch and said first rectifying device therein to allow said switch, said first rectifying device and said primary and secondary windings of said isolation transformer to be joined into a unitarily encapsulated package.

2. The package as recited in claim 1 wherein said primary winding of said isolation transformer further comprises a second tap, said first tap of said primary winding coupled to a first power input lead of said package and said second tap of said primary winding coupled to a second power input lead of said package.

3. The package as recited in claim 1 wherein said secondary winding of said isolation transformer further comprises a center tap, said first tap of said secondary winding coupled to a first power output lead of said package and said center tap of said secondary winding coupled to a second power output lead of said package.

4. The package as recited in claim 1 further comprising a plurality of leads for receiving said primary and secondary windings of said isolation transformer.

5. The package as recited in claim 4 wherein a first, second and third terminal of said switch are collinear, said first terminal of said switch coupled to said first tap of said primary winding.

6. The package as recited in claim 1 wherein said secondary winding of said isolation transformer further comprises a second tap, said second tap of said secondary winding adapted to couple a second rectifying device to said secondary winding.

7. The package as recited in claim 1 wherein said secondary winding of said isolation transformer further comprises a second tap, said second tap of said secondary winding adapted to couple a second rectifying device to said secondary winding, said encapsulant surrounding said first and second cavities to form said unitarily encapsulated package.

8. The package as recited in claim 1 wherein said encapsulant has a third cavity formed therein proximate said secondary winding, said third cavity exposing a second tap of said secondary winding and adapted to receive a second rectifying device therein, said second tap of said secondary winding adapted to couple said second rectifying device to said secondary winding, said first, second and third cavities adapted to be encapsulated after receiving said switch, said first rectifying device and said second rectifying device therein to allow said switch, said first rectifying device, said second rectifying device and said primary and secondary windings of said isolation transformer to be joined into a unitarily encapsulated package.

9. The package as recited in claim 1 wherein said encapsulant has a third cavity formed therein proximate said secondary winding, said third cavity exposing a second tap of said secondary winding and adapted to receive a second rectifying device therein, said second tap of said secondary winding adapted to couple said second rectifying device to said secondary winding, said first, second and third cavities adapted to be encapsulated after receiving said switch, said first rectifying device and said second rectifying device therein to allow said switch, said first rectifying device, said second rectifying device and said primary and secondary windings of said isolation transformer to be joined into a unitarily encapsulated package, said encapsulant surrounding said first, second and third cavities to form said unitarily encapsulated package.

10. A method of manufacturing a package for a power magnetic device, comprising the steps of:

registering a plurality of leads with respect to one another;

coupling a primary and secondary winding of an isolation transformer to said leads; and substantially surrounding said isolation transformer with an encapsulant, said step of surrounding further comprising the step of:

forming first and second cavities in said encapsulant proximate said primary winding and said secondary winding, said first cavity exposing a first tap of said primary winding and adapted to receive a switch therein, said first tap of said primary winding adapted to couple said switch to said primary winding, said second cavity exposing a first tap of said secondary winding and adapted to receive a first rectifying device therein, said first tap of said secondary winding adapted to couple said first rectifying device to said secondary winding, said first and second cavities adapted to be encapsulated after receiving said switch and said first rectifying device therein to allow said switch, said first rectifying device and said primary and secondary windings of said isolation transformer to be joined into a unitarily encapsulated package.

11. The method as recited in claim 10 wherein the step of coupling, further comprises the steps of coupling:

said first tap of said primary winding of said isolation transformer to a first power input lead; and a second tap of said primary winding of said isolation transformer to a second power input lead.

12. The method as recited in claim 10 wherein the step of coupling, further comprises the steps of coupling:

said first tap of said secondary winding of said isolation transformer to a first power output lead; and a center tap of said secondary winding of said isolation transformer to a second power output lead.

13. The method as recited in claim 10 wherein said plurality of leads is part of a lead frame, the method further comprising the step of removing an outer periphery of said lead frame.

14. The method as recited in claim 10 wherein a first, second and third terminal of said switch are collinear, said first terminal of said switch adapted to be coupled to said first tap of said primary winding.

15. The method as recited in claim 10 wherein said secondary winding of said isolation transformer further comprises a second tap, the step of forming further comprising the step of coupling said second tap of said secondary winding to a second rectifying device.

16. The method as recited in claim 10 wherein said secondary winding of said isolation transformer further comprises a second tap, the step of forming further comprising the steps of coupling said second tap of said secondary winding to a second rectifying device, the step of surrounding further comprising the step of surrounding said first and second cavities with said encapsulant to form said unitarily encapsulated package.

17. The method as recited in claim 10 wherein the step of surrounding further comprises the step of forming a third cavity proximate said secondary winding, said third cavity exposing a second tap of said secondary winding and adapted to receive a second rectifying device therein, said second tap of said secondary winding adapted to couple said second rectifying device to said secondary winding, said first, second and third cavities adapted to be encapsulated after receiving said switch, said first rectifying device and said second rectifying device therein to allow said switch, said first rectifying device, said second rectifying device and said primary and secondary windings of said isolation transformer to be joined into a unitarily encapsulated package.

18. The method as recited in claim 10 wherein the step of surrounding further comprises the steps of:
   forming a third cavity proximate said secondary winding, said third cavity exposing a second tap of said secondary winding and adapted to receive a second rectifying device therein, said second tap of said secondary winding adapted to couple said second rectifying device to said secondary winding, said first, second and third cavities adapted to be encapsulated after receiving said switch, said first rectifying device and said second rectifying device therein to allow said switch, said first rectifying device, said second rectifying device and said primary and secondary windings of said isolation transformer to be joined into a unitarily encapsulated package; and
   surrounding said first, second and third cavities with said encapsulant to form said unitarily encapsulated package.

19. A power converter, comprising:
   a power train having a power train input couplable to a source of electrical power and a power train DC output couplable to an electrical load, said power train including:
      a packaged power magnetic device containing an isolation transformer having a primary and secondary winding, said package comprising:
         an encapsulant substantially surrounding said isolation transformer, first and second cavities formed in said encapsulant proximate said primary winding and said secondary winding, said first cavity exposing a first tap of said primary winding and adapted to receive a switch therein, said first tap of said primary winding adapted to couple said switch to said primary winding, said second cavity exposing a first tap of said secondary winding and adapted to receive a first rectifying device therein, said first tap of said secondary winding adapted to couple said first rectifying device to said secondary winding, said first and second cavities adapted to be encapsulated after receiving said switch and said first rectifying device therein to allow said switch, said first rectifying device and said primary and secondary windings of said isolation transformer to be joined into a unitarily encapsulated package; and
      control circuitry for applying a control signal to said power train.

20. The power converter as recited in claim 19 wherein said primary winding of said isolation transformer further comprises a second tap, said first tap of said primary winding coupled to a first power input lead of said package and said second tap of said primary winding coupled to a second power input lead of said package.

21. The power converter as recited in claim 19 wherein said secondary winding of said isolation transformer further comprises a center tap, said first tap of said secondary winding coupled to a first power output lead of said package and said center tap of said secondary winding coupled to a second power output lead of said package.

22. The power converter as recited in claim 19 wherein said packaged power magnetic device further comprises a plurality of leads for receiving said primary and secondary windings of said isolation transformer.

23. The power converter as recited in claim 19 wherein a first, second and third terminal of said switch are collinear, said first terminal of said switch coupled to said first tap of said primary winding.

24. The power converter as recited in claim 19 wherein said secondary winding of said isolation transformer further comprises a second tap, said second tap of said secondary winding adapted to couple a second rectifying device to said secondary winding.

25. The power converter as recited in claim 19 wherein said secondary winding of said isolation transformer further comprises a second tap, said second tap of said secondary winding adapted to couple a second rectifying device to said secondary winding, said encapsulant surrounding said first and second cavities to form said unitarily encapsulated package.

26. The power converter as recited in claim 19 wherein said encapsulant has a third cavity formed therein proximate said secondary winding, said third cavity exposing a second tap of said secondary winding and adapted to receive a second rectifying device therein, said second tap of said secondary winding adapted to couple said second rectifying device to said secondary winding, said first, second and third cavities adapted to be encapsulated after receiving said switch, said first rectifying device and said second rectifying device therein to allow said switch, said first rectifying device, said second rectifying device and said primary and secondary windings of said isolation transformer to be joined into a unitarily encapsulated package.

27. The power converter as recited in claim 19 wherein said encapsulant has a third cavity formed therein proximate said secondary winding, said third cavity exposing a second tap of said secondary winding and adapted to receive a second rectifying device therein, said second tap of said secondary winding adapted to couple said second rectifying device to said secondary winding, said first, second and third cavities adapted to be encapsulated after receiving said switch, said first rectifying device and said second rectifying device therein to allow said switch, said first rectifying device, said second rectifying device and said primary and secondary windings of said isolation transformer to be joined into a unitarily encapsulated package, said encapsulant surrounding said first, second and third cavities to form said unitarily encapsulated package.

28. The power converter as recited in claim 19 wherein said power train further comprises a low-pass filter.

* * * * *